(12) United States Patent
Kamakura

(10) Patent No.: US 11,967,534 B2
(45) Date of Patent: Apr. 23, 2024

(54) METHOD OF MANUFACTURING SEMICONDUCTOR DEVICE

(71) Applicant: Kokusai Electric Corporation, Tokyo (JP)

(72) Inventor: Tsukasa Kamakura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 352 days.

(21) Appl. No.: 17/349,619

(22) Filed: Jun. 16, 2021

(65) Prior Publication Data

US 2021/0398864 A1 Dec. 23, 2021

(30) Foreign Application Priority Data

Jun. 22, 2020 (JP) .................. 2020-106771

(51) Int. Cl.
*H01L 21/77* (2017.01)
*H01L 21/66* (2006.01)

(52) U.S. Cl.
CPC .................. *H01L 22/12* (2013.01)

(58) Field of Classification Search
CPC ... H01L 22/12; H01L 21/31; H01L 21/68728; C23C 16/44; C23C 16/455
See application file for complete search history.

(56) References Cited

U.S. PATENT DOCUMENTS 6,753,255 B1 * 6/2004 Takada .............. H01L 21/67017
 438/758
7,573,582 B2 * 8/2009 Mikami ............. G01B 11/0683
 356/504

(Continued)

FOREIGN PATENT DOCUMENTS

JP 2003209058 A 7/2003
JP 2012-222024 A 11/2012

(Continued)

OTHER PUBLICATIONS

Lin, Tung-Ho, et al., "A virtual metrology scheme for predicting CVD thickness in semiconductor manufacturing," Proceedings 2006 IEEE International Conference on Robotics and Automation, 2006. ICRA 2006., Orlando, FL, USA, 2006, pp. 1054-1059.*
Cabuil, N., et al., "Process Monitoring And Surface Characterization By XPS In A Semiconductor Fabrication Line". AIP Conference Proceedings 931, Frontiers of Characterization and Metrology for Nanoelectronics, 191-195 (2007).*

(Continued)

*Primary Examiner* — Bret P Chen
(74) *Attorney, Agent, or Firm* — Edell, Shapiro & Finnan, LLC

(57) ABSTRACT

A technique capable of coping with change in the environment for each of the substrate placing surfaces is provided. According to one aspect thereof, there is provided a method of manufacturing a semiconductor device, including: (a) supplying a gas to a process vessel through branch pipes while substrates are placed on substrate placing surfaces arranged in the process vessel, respectively; (b) detecting at least one among: information of a component corresponding to each of the substrate placing surfaces; and an amount of the gas supplied to each of the branch pipes; (c) determining a state level of each of the substrate placing surfaces based on the detected information; and (d) selecting a substrate placing surface among the substrate placing surfaces to which a substrate subsequently loaded into the process vessel is to be transferred next according to the state level of each of the substrate placing surfaces.

20 Claims, 9 Drawing Sheets

(56) References Cited

U.S. PATENT DOCUMENTS

| | | | |
|---|---|---|---|
| 11,086,234 B2* | 8/2021 | Poiesz | H01L 21/68757 |
| 2001/0001954 A1* | 5/2001 | Urabe | H01L 21/28568 |
| | | | 118/728 |
| 2005/0221001 A1* | 10/2005 | Joe | C23C 16/4404 |
| | | | 427/248.1 |
| 2008/0069951 A1* | 3/2008 | Chacin | H01L 21/68735 |
| | | | 118/728 |
| 2011/0223694 A1* | 9/2011 | Uda | H01L 22/12 |
| | | | 257/E21.529 |
| 2014/0087568 A1* | 3/2014 | Noda | H01L 21/02277 |
| | | | 134/1.1 |
| 2016/0177444 A1* | 6/2016 | Baldasseroni | C23C 16/4585 |
| | | | 118/728 |
| 2018/0010986 A1* | 1/2018 | Matsuo | G06Q 30/016 |
| 2018/0025920 A1 | 1/2018 | Mizuguchi | |
| 2020/0105523 A1 | 4/2020 | Liu et al. | |
| 2021/0366792 A1* | 11/2021 | Fulford | H01L 21/67253 |

FOREIGN PATENT DOCUMENTS

| | | | | |
|---|---|---|---|---|
| JP | 2019208066 A | 12/2019 | | |
| KR | 10-2018-0010933 | 1/2018 | | |
| WO | WO 2004/057656 A1 * | 7/2004 | | H01L 21/205 |

OTHER PUBLICATIONS

Fischeneder, M., et al., "Tailored wafer holder for a reliable deposition of sputtered aluminium nitride thin films at low temperatures". Materials Science in Semiconductor Processing 71 (2017) 283-289.*

KIPO Office Action with English translation in Korean Application No. 10-2021-0077302, dated Nov. 10, 2022, 18 pages.

Office Action in corresponding Taiwan Patent Application No. 110118455, dated Feb. 17, 2022, with English translation.

* cited by examiner

FIG. 7

OPERATION INFORMATION TABLE 433

(A)

|  | PROCESSING TIME INFORMATION | GAS SUPPLY AMOUNT INFORMATION |
|---|---|---|
| BASE 210a | PT1 | V1 |
| BASE 210b | PT2 | V2 |
| BASE 210c | PT3 | V3 |
| BASE 210d | PT4 | V4 |

(B)

|  | COMPONENT OPERATION INFORMATION |
|---|---|
| BASE 210a | OT1 |
| BASE 210b | OT2 |
| BASE 210c | OT3 |
| BASE 210d | OT4 |

FIG. 8

STATE LEVEL TABLE 435

(A)

| STATE LEVEL | INFORMATION (FILM THICKNESS Th) |
|---|---|
| LEVEL #1 | $Th < A1$ |
| LEVEL #2 | $A1 \leq Th < B1$ |
| LEVEL #3 | $B1 \leq Th$ |

(B)

| STATE LEVEL | INFORMATION (COMPONENT OPERATION TIME OT) |
|---|---|
| LEVEL #1 | $OT < A2$ |
| LEVEL #2 | $A2 \leq OT < B2$ |
| LEVEL #3 | $B2 \leq OT$ |

FIG. 10

STATE LEVEL TABLE 435'

(A)

| STATE LEVEL | INFORMATION (FILM THICKNESS Th) |
|---|---|
| LEVEL #1-1 | Th < A3 |
| LEVEL #1-2 | A3 ≤ Th < B3 |
| LEVEL #2 | B3 ≤ Th < C3 |
| LEVEL #3 | C3 ≤ Th |

(B)

| STATE LEVEL | INFORMATION (COMPONENT OPERATION TIME OT) |
|---|---|
| LEVEL #1-1 | OT < A4 |
| LEVEL #1-2 | A4 ≤ OT < B4 |
| LEVEL #2 | B4 ≤ OT < C4 |
| LEVEL #3 | C4 ≤ OT |

METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2020-106771 filed on Jun. 22, 2020, the entire contents of which are hereby incorporated by reference.

TECHNICAL FIELD

The present disclosure relates to a method of manufacturing a semiconductor device.

BACKGROUND

A type of apparatus capable of collectively processing (or batch processing) a plurality of substrates in order to improve a production efficiency may be used as a substrate processing apparatus. For example, an apparatus provided with a plurality of substrate placing surfaces arranged in a process chamber may be used, wherein the plurality of substrates are processed while the plurality of substrates are mounted on the plurality of substrate placing surfaces, respectively.

When processing the plurality of substrates, the environment of the process chamber may change over time.

In the apparatus provided with the plurality of substrate placing surfaces, the environment may change for each of the substrate placing surfaces. In the present specification, a change in the environment refers to a change experienced as a substrate processing is continuously performed. For example, the change in the environment may include the deterioration of components corresponding to each of the substrate placing surfaces. Further, when the substrate processing is a film-forming process, the change in the environment may include a thickness of a film deposited on or around each of the substrate placing surfaces.

SUMMARY

Described herein is a technique capable of coping with the change in the environment for each of the substrate placing surfaces even when employing the type of apparatus provided with the plurality of substrate placing surfaces.

According to one aspect of the technique of the present disclosure, there is provided a method of manufacturing a semiconductor device, including: (a) supplying a gas to a process vessel through a plurality of branch pipes while a plurality of substrates are placed on a plurality of substrate placing surfaces arranged in the process vessel, respectively; (b) detecting at least one among: information of a component corresponding to each of the substrate placing surfaces; and an amount of the gas supplied to each of the branch pipes; (c) determining a state level of each of the substrate placing surfaces based on the detected information; and (d) selecting a substrate placing surface among the plurality of substrate placing surfaces to which a substrate subsequently loaded into the process vessel is to be transferred next according to the state level of each of the substrate placing surfaces.

BRIEF DESCRIPTION OF THE DRAWINGS

FIG. 7 is a diagram schematically illustrating an operation information table according to the first embodiment described herein.

FIG. 8 is a diagram schematically illustrating a state level table according to the first embodiment described herein.

FIG. 10 is a diagram schematically illustrating a state level table according to a second embodiment described herein.

DETAILED DESCRIPTION

Embodiments

Hereinafter, one or more embodiments (also simply referred to as "embodiments") according to the technique of the present disclosure will be described.

First Embodiment

Hereinafter, a first embodiment according to the technique of the present disclosure will be described.

First, a substrate processing apparatus 100 according to the present embodiment will be described with reference to FIGS. 1 through 5. A lower portion of FIG. 1 represents a front region of the substrate processing apparatus 100, and an upper portion of FIG. 1 represents a rear region of the substrate processing apparatus 100.

Substrate Processing Apparatus

Figure 1:
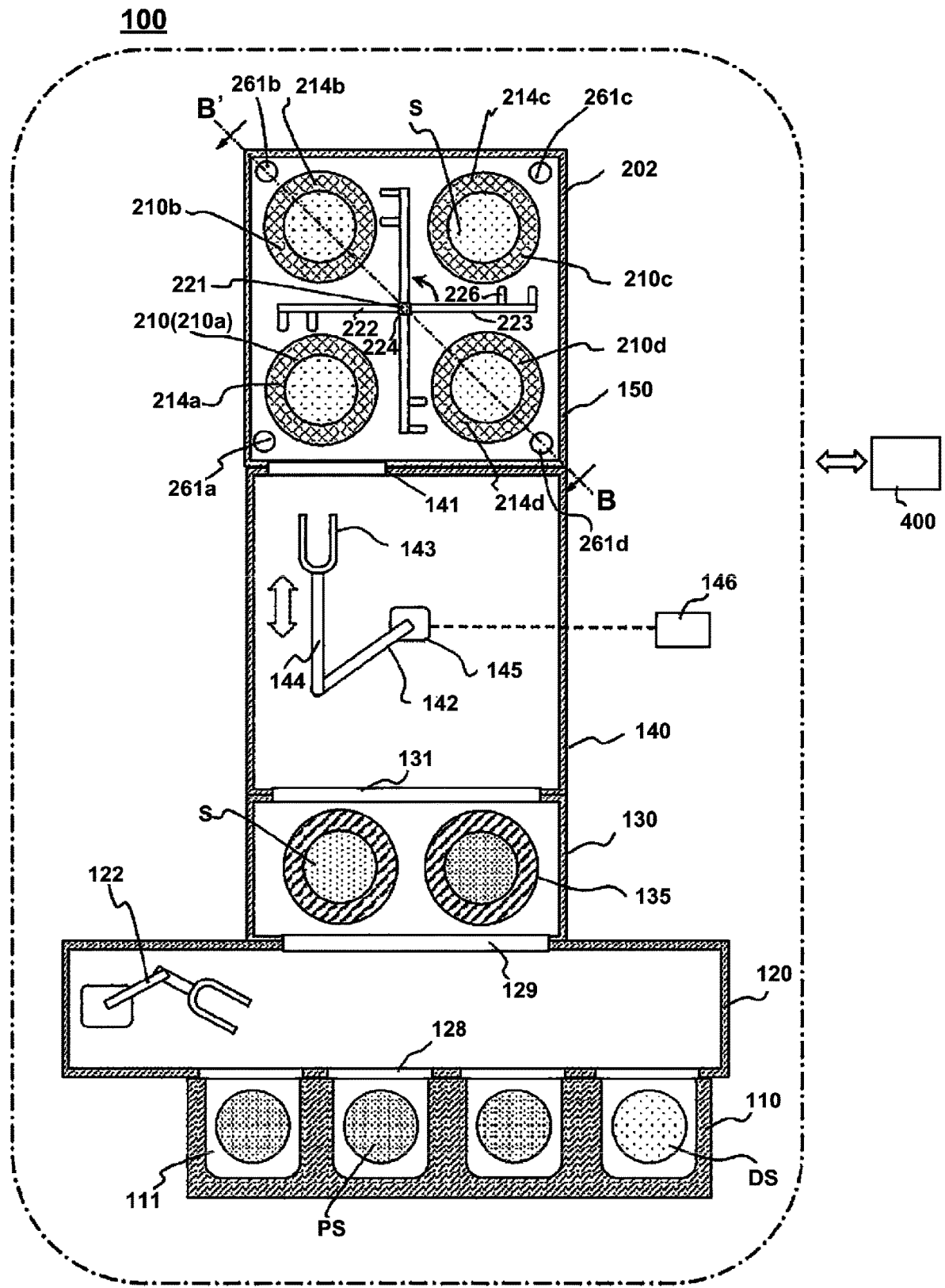
FIG. 1 is a diagram schematically illustrating a substrate processing apparatus according to a first embodiment described herein when viewed from above.

As shown in FIG. 1, the substrate processing apparatus 100 is constituted by an input/output (I/O) stage (also referred to as a "loading port") 110, an atmospheric transfer structure (also referred to as an "atmospheric transfer chamber") 120, a load lock structure (also referred to as a "load lock chamber") 130, a vacuum transfer structure (also referred to as a "vacuum transfer chamber") 140 and a substrate processing structure 150.

Atmospheric Transfer Structure and I/O Stage

The I/O stage 110 is provided at a front portion of the substrate processing apparatus 100. The I/O stage 110 is configured such that a plurality of pods including a pod 111 is placed on the I/O stage 110. Hereinafter, the plurality of the including the pod 111 may also be simply referred to as "pods 111". The pod 111 is used as a carrier for transferring a substrate such as a silicon (Si) substrate. The pod 111 is configured such that a plurality of substrates including a substrate S may be stored in a multistage manner in a horizontal orientation in the pod 111. Hereinafter, the plurality of substrates including the substrate S may also be simply referred to as "substrates S". For example, a plurality of processed or unprocessed product substrates including a product substrate PS on which already formed circuits and the like are mounted may be stored in the pod 111, or a plurality of dummy substrates including a dummy substrate DS may be stored in the pod 111. In the following description, the term "substrate S" may refer to the product substrate PS, may refer to the dummy substrate DS or both of the product substrate PS and the dummy substrate DS.

A cap (not shown) is installed at the pod 111. The cap is opened or closed by a pod opener (not shown). The pod opener is configured to open or close the cap of the pod 111 placed on the I/O stage 110. When the pod opener opens a substrate entrance 128, the substrate S may be loaded into the pod 111 or unloaded out of the pod 111. The pod 111 is provided to or discharged from the I/O stage 110 by an AMHS (automated material handling system) (not shown) serving as an automatic substrate transfer system.

The I/O stage 110 is provided adjacent to the atmospheric transfer structure 120. The load lock structure 130 described later is connected to a side of the atmospheric transfer structure 120 other than a side at which the I/O stage 110 is provided.

An atmospheric transfer robot 122 configured to transfer the substrate S is provided in the atmospheric transfer structure 120. The atmospheric transfer robot 122 is elevated or lowered by an elevator (not shown) installed in the atmospheric transfer structure 120 and is reciprocated laterally by a linear actuator (not shown).

A substrate loading/unloading port 129 configured to transfer the substrate S into or out of the load lock structure 130 is provided at a rear side of the atmospheric transfer structure 120. The substrate loading/unloading port 129 is opened or closed by a gate valve (not shown). When the substrate loading/unloading port 129 is opened by the gate valve, the substrate S may be loaded into the load lock structure 130 or unloaded out of the load lock structure 130.

Load Lock Structure

The load lock structure 130 is provided with a standby structure 135 on which the substrate S is supported. The standby structure 135 is configured to support the substrate S transferred from the atmospheric transfer structure 120 or the substrate S transferred from the vacuum transfer structure 140.

A substrate loading/unloading port 131 is provided between the load lock structure 130 and the vacuum transfer structure 140. A gate valve (not shown) is provided in the vicinity of the substrate loading/unloading port 131 such that the load lock structure 130 and the vacuum transfer structure 140 can be separated from each other.

Vacuum Transfer Structure

A vacuum transfer robot 142 configured to transfer the substrate S is provided in the vacuum transfer structure 140. The vacuum transfer robot 142 transfers the substrate S between the load lock structure 130 and the substrate processing structure 150. The vacuum transfer robot 142 includes at least a finger 143, an arm 144 and a base 145. Further, the vacuum transfer robot 142 includes a robot controller 146 configured to control an operation such as a rotating operation and a stretching operation of the arm 144.

The substrate S is supported on the finger 143, and the arm 144 is rotated and stretched under the control of the robot controller 146 such that the substrate S can be moved between the load lock structure 130 and the substrate processing structure 150.

Similarly, a substrate loading/unloading port 141 is also provided between the vacuum transfer structure 140 and the substrate processing structure 150. A gate valve (not shown) is provided in the vicinity of the substrate loading/unloading port 141 such that the vacuum transfer structure 140 and the substrate processing structure 150 can be separated from each other.

Substrate Processing Structure

Figure 2:
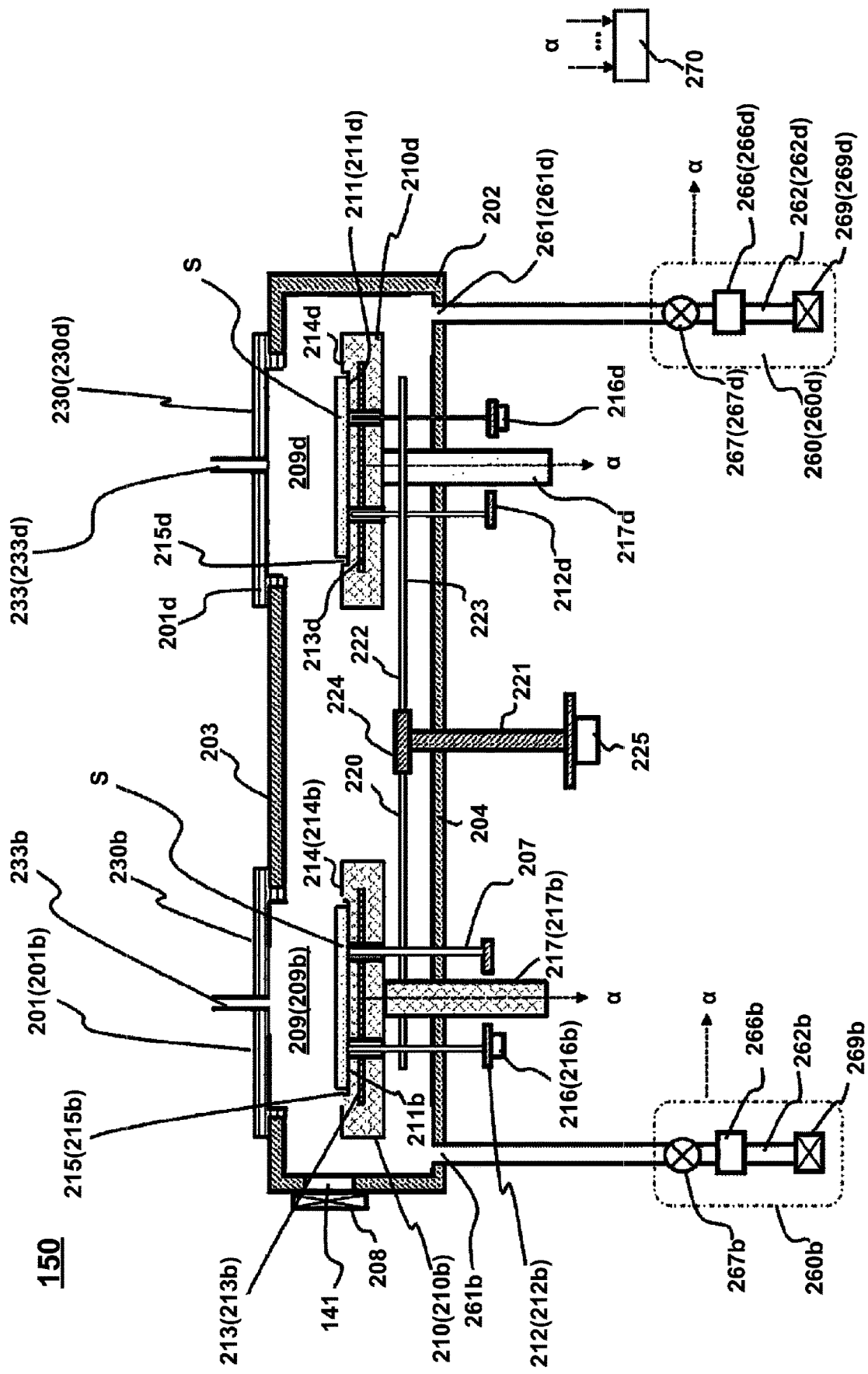
FIG. 2 is a diagram schematically illustrating a vertical cross-section of the substrate processing apparatus according to the first embodiment described herein taken along the line B-B' shown in FIG. 1.

Subsequently, a specific configuration of the substrate processing structure 150 will be described. As shown in FIGS. 1 and 2, the substrate processing structure 150 includes a process vessel 202. The process vessel 202 may also be referred to as a "process module". For example, the process vessel 202 is configured as a flat and sealed vessel whose horizontal cross-section is square. Further, the process vessel 202 is made of a metal material such as aluminum (Al) and stainless steel (SUS). A process chamber 201 in which the substrate S is processed is provided in the process vessel 202. The process chamber 201 is constituted by components such as a shower head 230 and a base 210, which will be described later.

The substrate loading/unloading port 141 is provided adjacent to a gate valve 208 at a side surface of the process vessel 202. The substrate S is transferred between the process chamber 201 and the vacuum transfer structure 140 through the substrate loading/unloading port 141.

The base 210 configured to heat the substrate S is arranged in the process chamber 201. A plurality of bases including the base 210 surrounds a shaft 221 (described later) along a circumferential direction of the process vessel 202. The base 210 may also be referred to as a "substrate support". An arrangement of the plurality of bases including the base 210 will be described with reference to FIG. 1. A vertical cross-section of the substrate processing apparatus 100 taken along the line B-B' shown in FIG. 1 corresponds to FIG. 2.

At least four bases including the base 210 are provided. Specifically, a base 210*a*, a base 210*b*, a base 210*c* and a base 210*d* are arranged clockwise from a position facing the substrate loading/unloading port 141. Hereinafter, the term "base 210" may individually or collectively refer to the base 210*a*, the base 210*b*, the base 210*c* and the base 210*d*.

The base 210 includes a substrate placing surface 211 on which the substrate S can be placed and a recess 215 on which the substrate placing surface 211 is formed. For example, as shown in FIG. 2, the base 210*b* includes a substrate placing surface 211*b* and a recess 215*b*, and the base 210*d* includes a substrate placing surface 211*d* and a recess 215*d*. Although not shown in the drawings, a substrate placing surface of the base 210*a* may be referred to as a "substrate placing surface 211*a*" (whose structure is substantially the same as the substrate placing surface 211*b*), a recess of the base 210*a* may be referred to as a "recess 215*a*" (whose structure is substantially the same as the recess 215*b*), a substrate placing surface of the base 210*c* may be referred to as a "substrate placing surface 211*c*" (whose structure is substantially the same as the substrate placing surface 211*b*), and a recess of the base 210*c* may be referred to as a "recess 215c" (whose structure is substantially the same as the recess 215b). Hereinafter, the term "substrate placing surface 211" may individually or collectively refer to the substrate placing surface 211a, the substrate placing surface 211b, the substrate placing surface 211c and the substrate placing surface 211d, and the term "recess 215" may individually or collectively refer to the recess 215a, the recess 215b, the recess 215c and the recess 215d. For example, a plurality of substrate placing surfaces such as the substrate placing surfaces 211a through 211d are arranged along the circumferential direction of the process vessel 202.

The base 210 is a part of a convex structure constituting the recess 215, and a surface 214 of the base 210 faces a gas supply structure (also referred to as a "gas supplier"). For example, a surface 214a of the base 210a, a surface 214b of the base 210b, a surface 214c of the base 210c are shown in FIG. 1. Hereinafter, the term "surface 214" may individually or collectively refer to the surface 214a, the surface 214b, the surface 214c and the surface 214d. Since the substrate S is not placed on the surface 214, the surface 214 may also be referred to as a "substrate non-placing surface 214" as an expression corresponding to the substrate placing surface 211.

The base 210 further includes a heater 213 serving as a heating source. For example, a heater 213b and a heater 213d are shown in FIG. 2. Although not shown in the drawings, a heater corresponding to the base 210a may be referred to as a "heater 213a" (whose structure is substantially the same as the heater 213b) and a heater corresponding to the base 210c may be referred to as a "heater 213c" (whose structure is substantially the same as the heater 213b). Hereinafter, the term "heater 213" may individually or collectively refer to the heater 213a, the heater 213b, the heater 213c and the heater 213d. Through-holes through which lift pins 207 penetrate are provided at positions of the base 210 corresponding to the lift pins 207.

The base 210 is supported by a shaft 217. For example, a shaft 217b and a shaft 217d are shown in FIG. 2. Although not shown in the drawings, a shaft corresponding to the base 210a may be referred to as a "shaft 217a" (whose structure is substantially the same as the shaft 217b) and a shaft corresponding to the base 210c may be referred to as a "shaft 217c" (whose structure is substantially the same as the shaft 217b). Hereinafter, the term "shaft 217" may individually or collectively refer to the shaft 217a, the shaft 217b, the shaft 217c and the shaft 217d. The shaft 217 penetrates a bottom 204 of the process vessel 202.

A diameter of the substrate placing surface 211 is set to be slightly greater than a diameter of the substrate S. Therefore, when the substrate S is placed on the substrate placing surface 211, a gap which does not support the substrate S is provided on the substrate placing surface 211.

The lift pins 207 are provided so as to penetrate the bottom 204. The lift pins 207 are arranged at positions where the lift pins 207 can pass through the through-holes provided in the base 210. For example, front ends (tips) of the lift pins 207 support the substrate S when the substrate S is loaded or unloaded.

A lift pin support 212 is provided at lower ends of the lift pins 207. For example, a lift pin support 212b and a lift pin support 212d are shown in FIG. 2. Although not shown in the drawings, a lift pin support corresponding to the base 210a may be referred to as a "lift pin support 212a" (whose structure is substantially the same as the lift pin support 212b) and a lift pin support corresponding to the base 210c may be referred to as a "lift pin support 212c" (whose structure is substantially the same as the lift pin support 212b). Hereinafter, the term "lift pin support 212" may individually or collectively refer to the lift pin support 212a, the lift pin support 212b, the lift pin support 212c and the lift pin support 212d. The lift pin support 212 is provided with a substrate elevator (which is a substrate elevating structure) 216. For example, a substrate elevator 216b and a substrate elevator 216d are shown in FIG. 2. Although not shown in the drawings, a substrate elevator corresponding to base 210a may be referred to as a "substrate elevator 216a" (whose structure is substantially the same as the substrate elevator 216b) and a substrate elevator corresponding to the base 210c may be referred to as a "substrate elevator 216c" (whose structure is substantially the same as the substrate elevator 216b). Hereinafter, the term "substrate elevator 216" may individually or collectively refer to the substrate elevator 216a, the substrate elevator 216b, the substrate elevator 216c and the substrate elevator 216d. The substrate elevator 216 is configured to elevate or lower the lift pins 207. The lift pin support 212 and the substrate elevator 216 are provided corresponding to each base 210 (that is, each of the bases 210a through 210d).

The shower head 230 serving as a gas dispersion structure is provided at a lid 203 of the process vessel 202 at a position facing the substrate placing surface 211. For example, a shower head 230a facing the substrate placing surface 211a, a shower head 230b facing the substrate placing surface 211b, a shower head 230c facing the substrate placing surface 211c and a shower head 230d facing the substrate placing surface 211d are provided. Hereinafter, the term "shower head 230" may individually or collectively refer to the shower head 230a, the shower head 230b, the shower head 230c and the shower head 230d. When viewed from above, a plurality of shower heads such as the shower heads 230a through 230d are arranged as shown in FIG. 4.

Figure 4:
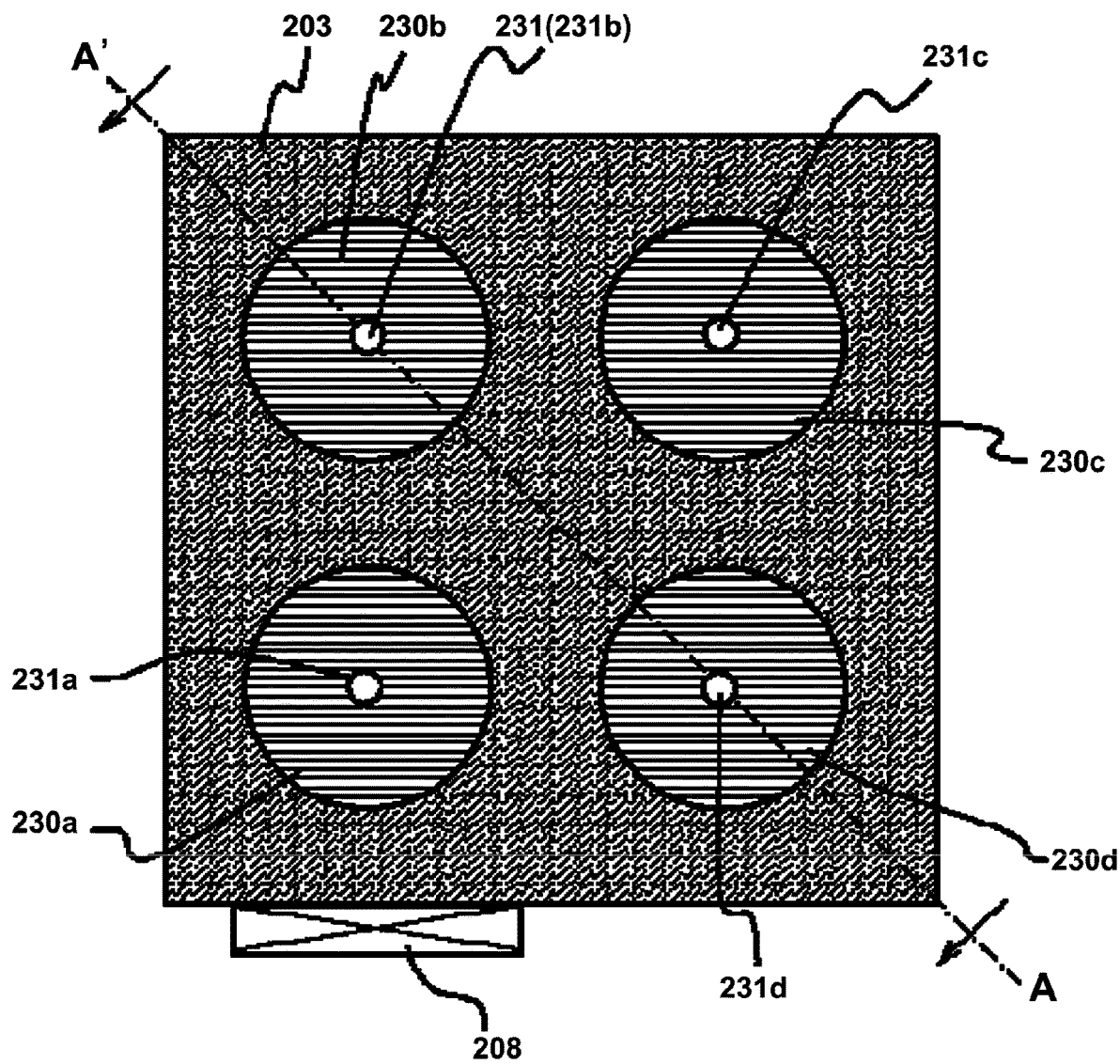
FIG. 4 is a diagram schematically illustrating a process vessel of the substrate processing apparatus according to the first embodiment described herein when viewed from above.

As shown in FIG. 4, the shower head 230 is provided with a gas introduction hole 231. Specifically, the shower head 230a is provided with a gas introduction hole 231a, the shower head 230b is provided with a gas introduction hole 231b, the shower head 230c is provided with a gas introduction hole 231c and the shower head 230d is provided with a gas introduction hole 231d. The gas introduction holes 231a, 231b, 231c and 231d communicate with a common gas supply pipe 301 described later. Hereinafter, the term "gas introduction hole 231" may individually or collectively refer to the gas introduction hole 231a, the gas introduction hole 231b, the gas introduction hole 231c and the gas introduction hole 231d. A vertical cross-section of the substrate processing apparatus 100 taken along the line A-A' shown in FIG. 4 corresponds to FIG. 2.

A space between the shower head 230 and the substrate S is referred to as a "process space 209". For example, a process space 209b and a process space 209d are shown in FIG. 2. Although not shown in the drawings, a process space corresponding to the base 210a may be referred to as a "process space 209a" (whose structure is substantially the same as the process space 209b) and a process space corresponding to the base 210c may be referred to as a "process space 209c" (whose structure is substantially the same as the process space 209b). Hereinafter, the term "process space 209" may individually or collectively refer to the process space 209a, the process space 209b, the process space 209c and the process space 209d. A structure constituting the process space 209 is referred to as the process chamber 201. According to the present embodiment, as shown in FIG. 2, a structure constituting the process space 209b and including at least the shower head 230b and the base 210b is referred to as a "process chamber 201b", and a structure constituting the process space 209d and including at least the shower head 230d and the base 210d is referred to as a "process chamber 201d". Although not shown in the drawings, a structure constituting the process space 209a and including at least the shower head 230a and the base 210a may be referred to as a "process chamber 201a", and a structure constituting the process space 209c and including at least the shower head 230c and the base 210c may be referred to as a "process chamber 201c". Hereinafter, the term "process chamber 201" may individually or collectively refer to the process chamber 201a, the process chamber 201b, the process chamber 201c and the process chamber 201d.

While the present embodiment is described by way of an example in which the process chamber 201 includes at least the shower head 230 and the base 210, the present embodiment is not limited thereto. For example, a structure constituting the process space 209 in which the substrate S is processed may be used as the process chamber 201. Depending on the structure of the substrate processing apparatus 100, the process chamber 201 may not be limited to a structure of the shower head 230. The same applies to other process chambers.

The base 210 is arranged around the shaft 221 as shown in FIG. 1. A rotation arm 222 is provided on the shaft 221. The rotation arm 222 includes a plurality of arms 223 and a fixing structure 224 capable of fixing each of the arms 223 to the shaft 221. The fixing structure 224 is fixed to the shaft 221 on the shaft 221. Each of the arms 223 is arranged radially around the fixing structure 224.

The shaft 221 is provided to penetrate the bottom 204 of the process vessel 202, and an elevating and rotating structure 225 is provided outside of the process vessel 202 on a side of the shaft 221 other than a side at which the rotation arm 222 is provided. The elevating and rotating structure 225 is configured to elevate, lower or rotate the shaft 221. The shaft 221 can be elevated or lowered by the elevating and rotating structure 225 independently of the base 210. For example, a rotation direction of the shaft 221 is shown in a direction of an arrow in FIG. 1.

A plurality of claws 226 protruding in a rotation direction of the rotation arm 222 are provided at front ends of the plurality of arms 223, respectively. The claws 226 are configured to support a rear surface of the substrate S.

Figure 3:
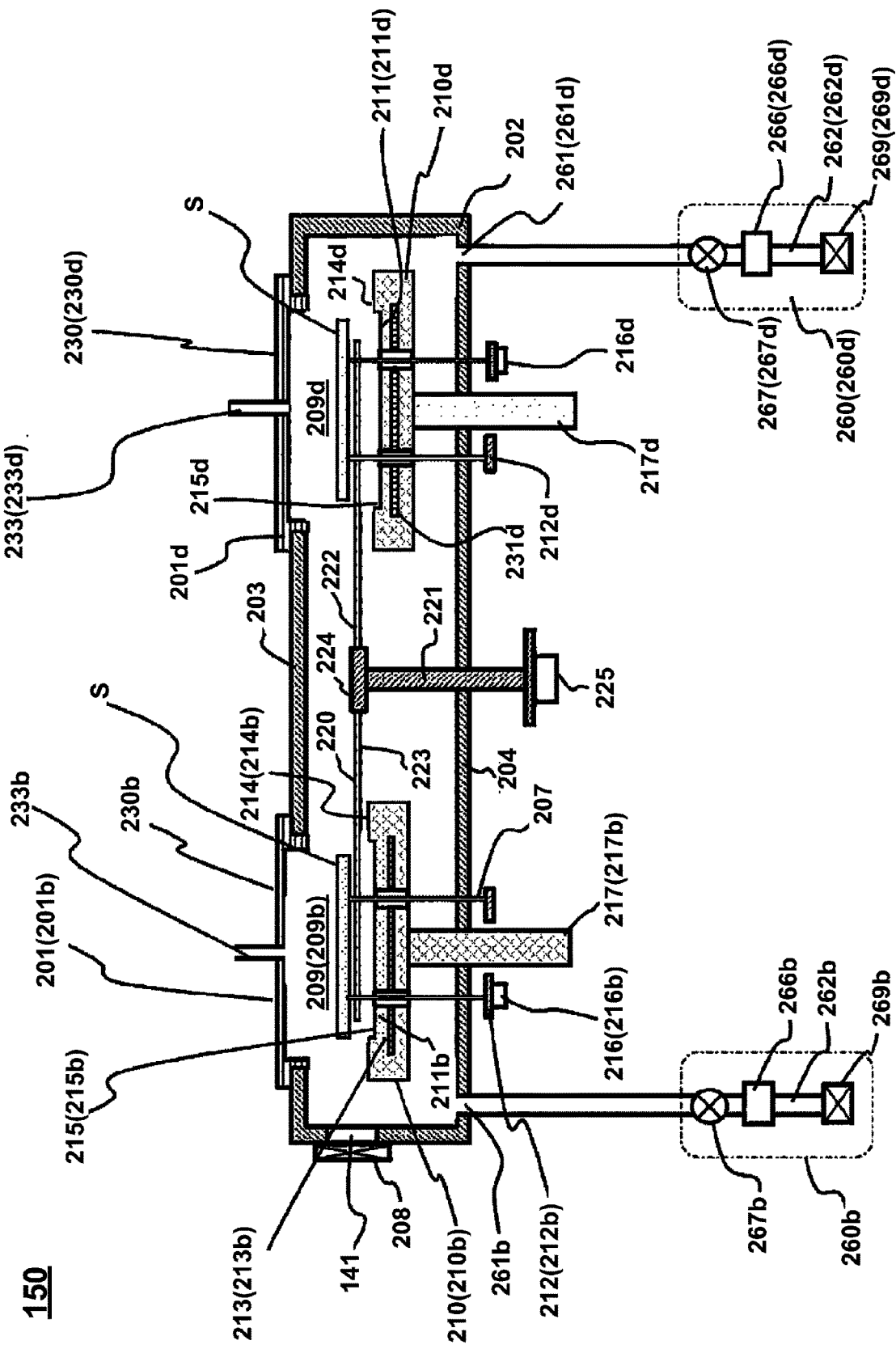
FIG. 3 is a diagram schematically illustrating another vertical cross-section of the substrate processing apparatus according to the first embodiment described herein.

When the rotation arm 222 picks up the substrate S from the base 210, the lift pins 207 are elevated from a state shown in FIG. 2 and the shaft 221 is elevated. Thereby, as shown in FIG. 3, the rotation arm 222 is disposed at a position higher than that of the substrate placing surface 211, and the lift pins 207 support the product substrate PS above the substrate placing surface 211 at a position higher than the rotation arm 222. By rotating the rotation arm 222, the claws 226 are arranged below the substrate S. Then, by lowering the lift pins 207, the substrate S is moved onto the claws 226.

When moving the substrate S from the rotation arm 222 to the base 210, the lift pins 207 and the rotation arm 222 are controlled in the order reverse to that of picking up the substrate S from the base 210 described above. When performing a substrate processing described later, the rotation arm 222 stands by below the process vessel 202 as shown in FIG. 2.

The shaft 221, the plurality of arms 223 and the fixing structure 224 are collectively referred to as a substrate rotator (which is a substrate rotating structure) 220. The substrate rotator 220 may include the elevating and rotating structure 225. The substrate rotator 220 may also be referred to as a "substrate transfer structure". Further, any combination of the substrate elevator 216 and the substrate rotator 220 or all combinations thereof may be referred to as an "elevating structure".

Gas Exhaust System

A gas exhaust system (which is a gas exhauster) 260 configured to exhaust an inner atmosphere of the process vessel 202 will be described. The gas exhaust system 260 is provided so as to correspond to the process space 209 (that is, the process space 209a through the process space 209d). For example, as shown in FIG. 2, a gas exhaust system 260b is provided corresponding to the process space 209b and a gas exhaust system 260d is provided corresponding to the process space 209d. Although not shown in the drawings, a gas exhaust system corresponding to the process space 209a may be referred to as a "gas exhaust system 260a" (whose structure is substantially the same as the gas exhaust system 260b) and a gas exhaust system corresponding to the process space 209c may be referred to as a "gas exhaust system 260c" (whose structure is substantially the same as the gas exhaust system 260b). Hereinafter, the term "gas exhaust system 260" may individually or collectively refer to the gas exhaust system 260a, the gas exhaust system 260b, the gas exhaust system 260c and the gas exhaust system 260d.

The gas exhaust system 260 includes an exhaust pipe 262 communicating with an exhaust hole 261 and further includes an APC (Automatic Pressure Controller) 266 provided in the exhaust pipe 262. For example, as shown in FIG. 2, the gas exhaust system 260b includes an exhaust pipe 262b communicating with an exhaust hole 261b, and further includes an APC 266b provided in the exhaust pipe 262b. For example, as shown in FIG. 2, the gas exhaust system 260d includes an exhaust pipe 262d communicating with an exhaust hole 261d, and further includes an APC 266d provided in the exhaust pipe 262d. Although not shown in the drawings, an exhaust pipe and an APC of the gas exhaust system 260a may be referred to as an "exhaust pipe 262a" (whose structure is substantially the same as the exhaust pipe 262b) and an "APC 266a" (whose structure is substantially the same as the APC 266b), respectively, and an exhaust hole communicating with the exhaust pipe 262a may be referred to as an "exhaust hole 261a" (whose structure is substantially the same as the exhaust hole 261b). Although not shown in the drawings, an exhaust pipe and an APC of the gas exhaust system 260c may be referred to as an "exhaust pipe 262c" (whose structure is substantially the same as the exhaust pipe 262b) and an "APC 266c" (whose structure is substantially the same as the APC 266b), respectively, and an exhaust hole communicating with the exhaust pipe 262c may be referred to as an "exhaust hole 261c" (whose structure is substantially the same as the exhaust hole 261b). Hereinafter, the term "exhaust pipe 262" may individually or collectively refer to the exhaust pipe 262a, the exhaust pipe 262b, the exhaust pipe 262c and the exhaust pipe 262d, the term "APC 266" may individually or collectively refer to the APC 266a, the APC 266b, the APC 266c and the APC 266d, and the term "exhaust hole 261" may individually or collectively refer to the exhaust hole 261a, the exhaust hole 261b, the exhaust hole 261c and the exhaust hole 261d. The APC 266 includes a valve body (not shown) whose opening degree can be adjusted. The APC 266 can adjust a conductance of the exhaust pipe 262 in accordance with an instruction from a controller 400. Further, a valve 267 is provided at the exhaust pipe 262 at an upstream side of the APC 266. For example, as shown in FIG. 2, a valve 267b is provided at the exhaust pipe 262b and a valve 267d is provided at the exhaust pipe 262d. Although not shown in the drawings, a valve provided at the exhaust pipe 262a may be referred to as a "valve 267a" (whose structure is substantially the same as the valve 267b) and a valve provided at the exhaust pipe 262c may be referred to as a "valve 267c" (whose structure is substantially the same as the valve 267b) Hereinafter, the term "valve 267" may individually or collectively refer to the valve 267a, the valve 267b, the valve 267c and the valve 267d.

The exhaust pipe 262, the valve 267 and the APC 266 may be collectively referred to as the gas exhaust system 260.

The exhaust pipe 262, a pressure monitor unit (not shown), the valve 267 and the APC 266 may be collectively referred to as an "exhaust system" or an "exhaust structure". A dry pump (DP) 269 is provided at a downstream side of the exhaust pipe 262. The dry pump 269 is capable of exhausting an inner atmosphere of the process chamber 201 through the exhaust pipe 262. According to the present embodiment, the dry pump 269 is provided for each gas exhaust system 260 (that is, the gas exhaust system 260a through the gas exhaust system 260d). However, the present embodiment is not limited thereto. For example, the dry pump 269 may be provided in common to each of the gas exhaust systems 260a through 260d.

A reference character "a" shown in FIG. 2 indicates that each configuration and a sensor 270 are electrically connected. Specifically, the sensor 270 is electrically connected to the heater 213 (that is, the heater 213a through the heater 213d) and the gas exhaust system 260 (that is, the gas exhaust system 260a through the gas exhaust system 260d).

The sensor 270 is configured to detect a state of each configuration. For example, the sensor 270 is configured to detect an operation time of the heater 213 or the number of times of operating the heater 213, and configured to detect an operation time of the valve 267 or the APC 266 or the number of times of operating the valve 267 or the APC 266. In FIG. 3, for convenience of explanation, the sensor 270 is omitted.

Gas Supply System

Subsequently, a gas supply system (which is the gas supply structure) 300 will be described with reference to FIG. 5. For example, the gas supply system 300 communicating with the gas introduction hole 231 (that is, the gas introduction hole 231a through the gas introduction hole 231d) will be described.

The gas introduction hole 231 is configured to communicate with a branch pipe 305. That is, the gas introduction hole 231a, the gas introduction hole 231b, the gas introduction hole 231c and the gas introduction hole 231d are configured to communicate with a branch pipe 305a, a branch pipe 305b, a branch pipe 305c and a branch pipe 305d, respectively. Hereinafter, the term "branch pipe 305" may individually or collectively refer to the branch pipe 305a, the branch pipe 305b, the branch pipe 305c and the branch pipe 305d. The branch pipe 305 (that is, the branch pipe 305a through the branch pipe 305d) is connected to the common gas supply pipe 301 via a collection pipe 306.

The shower head 230 (that is, each of the shower head 230a through the shower head 230d) is connected to the branch pipe 305 (that is, each of the branch pipe 305a through the branch pipe 305d). That is, each branch pipe 305 (that is, each of the branch pipe 305a through the branch pipe 305d) is provided corresponding to each substrate placing surface 211 (that is, each of the substrate placing surface 211a through the substrate placing surface 211d). A valve 302 and a mass flow controller 303 are provided at the branch pipe 305. That is, a valve 302a and a mass flow controller 303a are provided at the branch pipe 305a, a valve 302b and a mass flow controller 303b are provided at the branch pipe 305b, a valve 302c and a mass flow controller 303c are provided at the branch pipe 305c and a valve 302d and a mass flow controller 303d are provided at the branch pipe 305d. Hereinafter, the term "valve 302" may individually or collectively refer to the valve 302a, the valve 302b, the valve 302c and the valve 302d, and the term "mass flow controller 303" may individually or collectively refer to the mass flow controller 303a, the mass flow controller 303b, the mass flow controller 303c and the mass flow controller 303d. A flow rate meter 307 is connected to the mass flow controller 303. That is, a flow rate meter 307a is connected to the mass flow controller 303a, a flow rate meter 307b is connected to the mass flow controller 303b, a flow rate meter 307c is connected to the mass flow controller 303c and a flow rate meter 307d is connected to the mass flow controller 303d. Hereinafter, the term "flow rate meter 307" may individually or collectively refer to the flow rate meter 307a, the flow rate meter 307b, the flow rate meter 307c and the flow rate meter 307d. A supply amount of a gas to each process chamber 201 (that is, each of the process chamber 201a through the process chamber 201d) is detected by a flow rate measured by the flow rate meter 307 and a measurement time.

A supply amount of the gas though the branch pipe 305 is measured by the flow rate meter 307. The supply amount of the gas to each process chamber 201 (that is, each of the process chamber 201a through the process chamber 201d) can be adjusted using the valve 302 and the mass flow controller (MFC) 303. A first gas supply pipe 311 and a second gas supply pipe 321 are connected to the common gas supply pipe 301.

A common gas supply system 330 is constituted mainly by the branch pipe 305, the collection pipe 306, the valve 302 and the mass flow controller 303. The common gas supply system 330 may further include the flow rate meter 307.

A first gas supply source 312, a mass flow controller 313 serving as a flow rate controller (flow rate control structure) and a valve 314 serving as an opening/closing valve are sequentially provided in order at the first gas supply pipe 311 from an upstream side toward a downstream side of the first gas supply pipe 311.

The first gas supply source 312 is a source of a first gas (also referred to as a "first element-containing gas") containing a first element. The first element-containing gas serves as a source gas, which is one of process gases. According to the present embodiment, for example, the first element includes silicon (Si). That is, for example, the first element-containing gas includes a silicon-containing gas. Specifically, dichlorosilane ($SiH_2Cl_2$, also referred to as DCS) or hexachlorodisilane ($Si_2Cl_6$, also referred to as HCDS) gas may be used as the silicon-containing gas.

A first gas supply system (also referred to as a "silicon-containing gas supply system") 310 is constituted mainly by the first gas supply pipe 311, the mass flow controller 313 and the valve 314.

A second gas supply source 322, a mass flow controller 323 and a valve 324 serving as an opening/closing valve are sequentially provided in order at the second gas supply pipe 321 from an upstream side toward a downstream side of the second gas supply pipe 321.

The second gas supply source 322 is a source of a second gas (also referred to as a "second element-containing gas")

containing a second element. The second element-containing gas is one of the process gases. The second element-containing gas may serve as a reactive gas.

According to the present embodiment, the second element-containing gas contains the second element different from the first element. For example, the second element includes oxygen (O). That is, according to the present embodiment, for example, the second element-containing gas includes an oxygen-containing gas. Specifically, ozone gas ($O_3$ gas) may be used as the oxygen-containing gas.

A second gas supply system (also referred to as a "reactive gas supply system") 320 is constituted mainly by the second gas supply pipe 321, the mass flow controller 323 and the valve 324.

Any one of the common gas supply system 330, the first gas supply system 310 and the second gas supply system 320, or a combination thereof may be referred to as the gas supply system 300.

Figure 5:
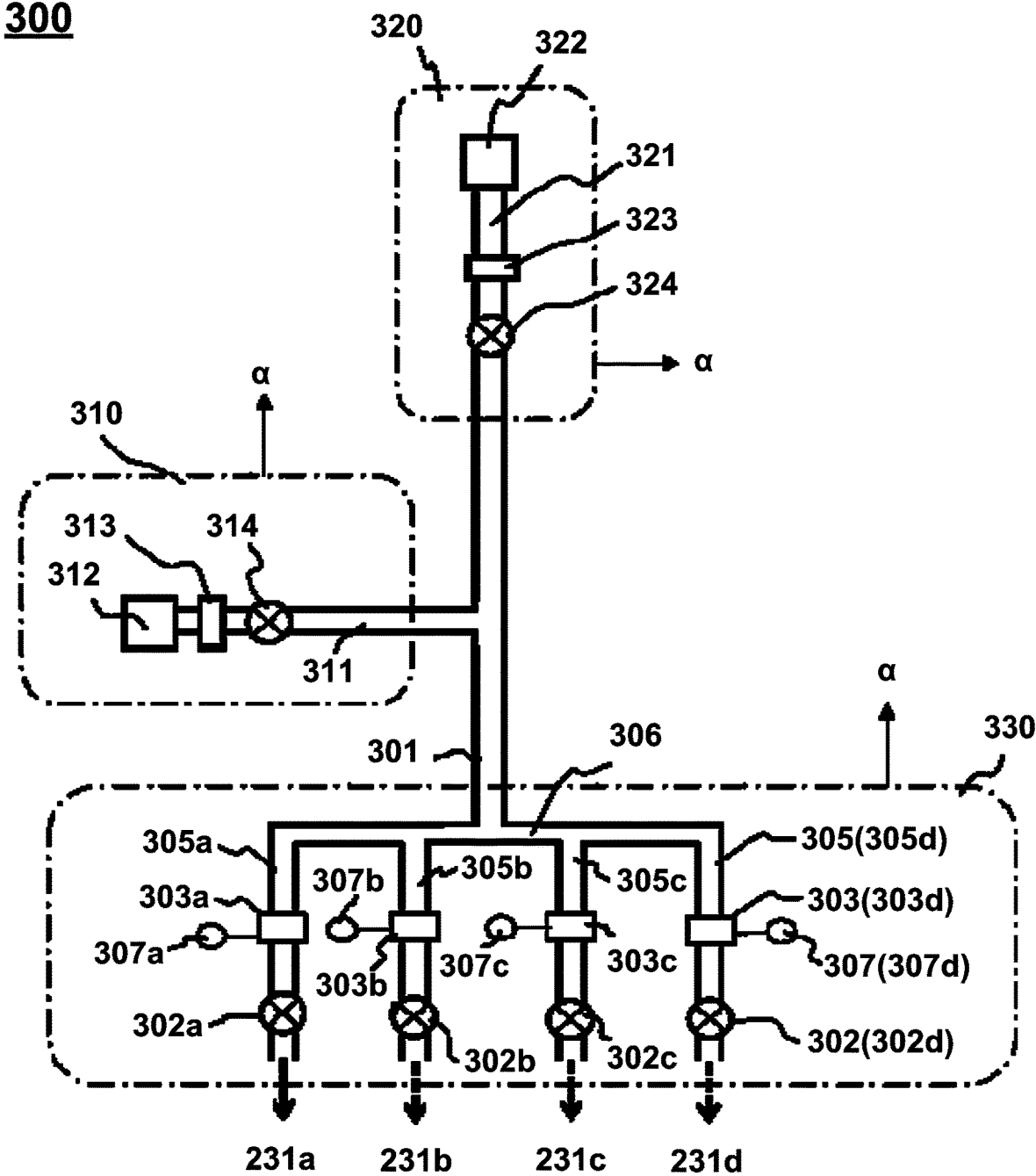
FIG. 5 is a diagram schematically illustrating a gas supply structure of the substrate processing apparatus according to the first embodiment described herein.

The reference character "α" shown in FIG. 5 indicates that each configuration and the sensor 270 are electrically connected. Specifically, the sensor 270 is electrically connected to the valves and the mass flow controllers of the common gas supply system 330, the first gas supply system 310 and the second gas supply system 320. Further, the sensor 270 may be electrically connected to the flow rate meter 307.

The sensor 270 is configured to detect a state of each configuration described above. For example, the sensor 270 is configured to detect an operation time of each mass flow controller or the number of times of operating each mass flow controller, and configured to detect an operation time of each valve or the number of times of operating each valve. When the sensor 270 is electrically connected to the flow rate meter 307, the sensor 270 is configured to detect the flow rate of each branch pipe 305 (that is, each of the branch pipe 305a through the branch pipe 305d).

The flow rate meter 307 and the sensor 270 are collectively referred to as a "detection structure". Alternatively, the flow rate meter 307 alone or the sensor 270 alone may be referred to as the "detection structure".

Controller

Figure 6:
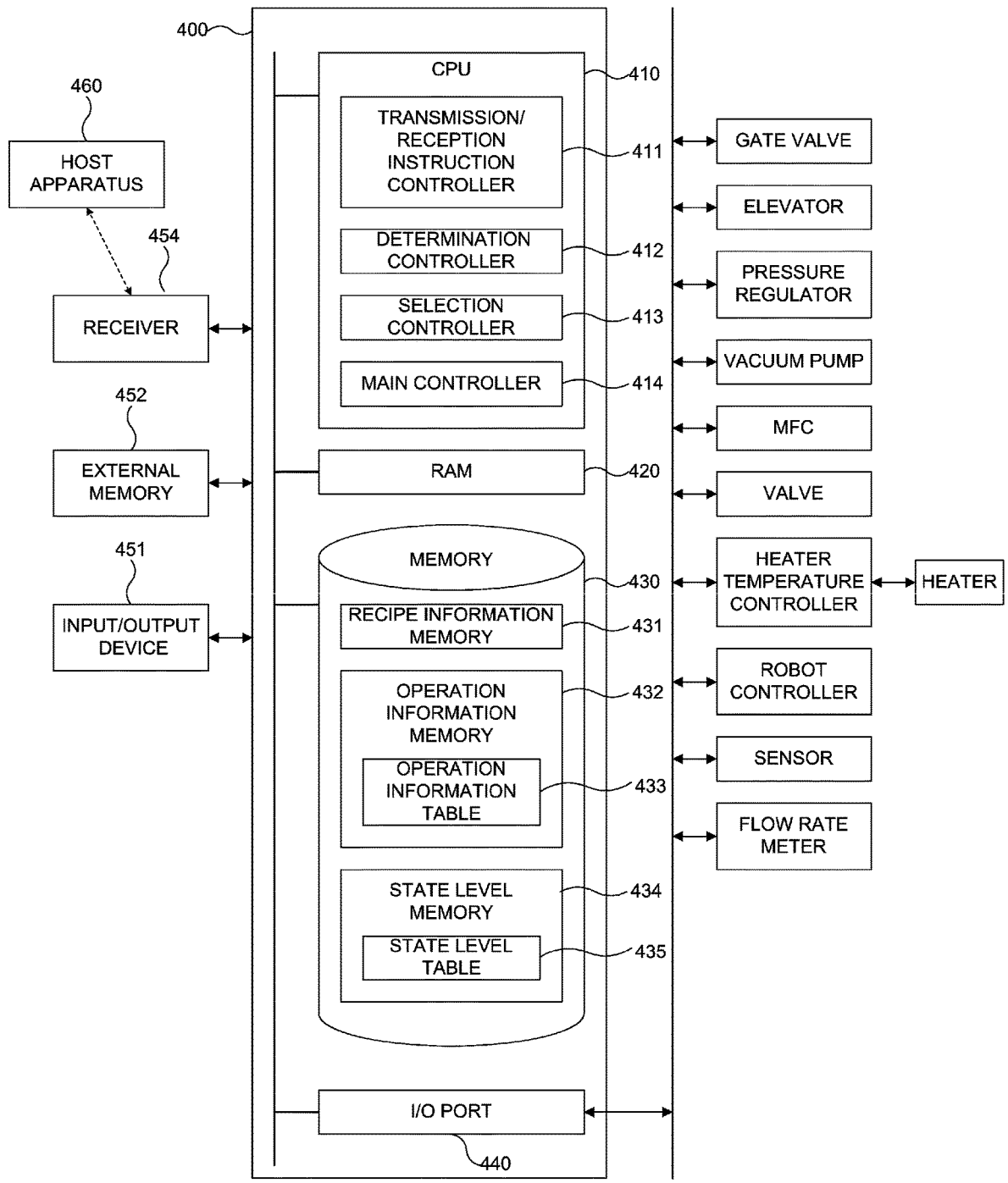
FIG. 6 is a diagram schematically illustrating a controller of the substrate processing apparatus according to the first embodiment described herein.

Subsequently, the controller 400 will be described. The controller 400 may also be referred to as a "control structure". The substrate processing apparatus 100 includes the controller 400 configured to control operations of components constituting the substrate processing apparatus 100. As shown in FIG. 6, the controller 400 at least includes an arithmetic processor 410 such as a CPU (Central Processing Unit), a temporary memory 420 such as a RAM (Random Access Memory), a memory 430 and an I/O port (input/output port) 440. The controller 400 is connected to the components of the substrate processing apparatus 100 via the I/O port 440.

The arithmetic processor 410 includes a transmission/reception instruction controller 411, a determination controller 412, a selection controller 413 and a main controller 414. The transmission/reception instruction controller 411 is configured to control the transmission or the reception of signals in the substrate processing apparatus 100 and the transmission or the reception of signals between the substrate processing apparatus 100 and apparatuses surrounding the substrate processing apparatus 100. The determination controller 412 is configured to determine a state of the base 210. The selection controller 413 is configured to select the base 210 to which the substrate S is transferred.

The main controller 414 is configured to call a program or a recipe from the memory 430 in accordance with an instruction from a host apparatus 460 or a user, and configured to control the operations of the components of the substrate processing apparatus 100 such as the robot controller 146 according to the contents of the instruction. The memory 430 includes a recipe information memory 431 configured to store recipe information, an operation information memory 432 and a state level memory 434. The operation information memory 432 and the state level memory 434 will be described later.

The controller 400 may be embodied by a dedicated computer or by a general-purpose computer. According to the present embodiment, for example, the controller 400 may be embodied by preparing an external memory 452 storing the program and by installing the program onto the general-purpose computer using the external memory 452. For example, the external memory 452 may include a magnetic tape, a magnetic disk such as a flexible disk and a hard disk, an optical disk such as a CD and a DVD, a magneto-optical disk such as an MO and a semiconductor memory such as a USB memory (USB flash drive) and a memory card. The means for providing the program to the computer is not limited to the external memory 452. For example, the program may be supplied to the computer (general-purpose computer) using communication means such as the Internet and a dedicated line. The program may be provided to the computer without using the external memory 452 by receiving the information (that is, the program) from the host apparatus 460 via a receiver 454. In addition, a user can input an instruction to the controller 400 using an input/output device 451 such as a keyboard and a touch panel.

The memory 430 or the external memory 452 may be embodied by a non-transitory computer readable recording medium. Hereafter, the memory 430 and the external memory 452 may be collectively referred to as the recording medium. In the present specification, the term "recording medium" may refer to the memory 430 alone, may refer to only the external memory 452 alone or may refer to both of the memory 430 and the external memory 452.

Subsequently, the operation information memory 432 will be described with reference to FIG. 7. The operation information memory 432 includes an operation information table 433 shown in FIG. 7. The operation information table 433 is a table in which the operations of each base 210 (that is, each of the base 210a through the base 210d) and the substrate processing apparatus 100 are associated with each other. In "(A)" of the operation information table 433, processing time information of each base 210 (that is, each of the base 210a through the base 210d) and gas supply amount information per unit time of each branch pipe 305 (that is, each of the branch pipe 305a through the branch pipe 305d) are recorded. In "(B)" of the operation information table 433, component operation information such as an operation time of a component (for example, the heater 213) of the base 210 is recorded.

In "(A)" of the operation information table 433, the processing time information (PT) indicates an integrated time of supplying the process gases. The processing time information PT is reset when the base 210 is cleaned or replaced such that the recess 215 and the surface 214 are in a clean state.

The gas supply amount information indicates the gas supply amount per unit time. The gas supply amount information may be obtained by detecting the time controlled by the main controller 414 or the gas supply amount detected by the flow rate meter 307 and inputting the detected data into the operation information table 433.

In "(B)" of the operation information table 433, the component operation information indicates operation information of the component corresponding to each base 210 (that is, each of the base 210a through the base 210d). In other words, the component operation information indicates the operation information of the component corresponding to each substrate placing surface 211 (that is, each of the substrate placing surface 211a through the substrate placing surface 211d). For example, the operation information of the component may include an operation time OT. For example, the component corresponding to the base 210 may include the heater 213, a component for a heater control system (not shown), a component for the gas supply system 300 and a component for the gas exhaust system 260. When plasma is used in the substrate processing apparatus 100, the components corresponding to the base 210 may further include a component for a plasma control system (not shown). When a maintenance operation such as a replacement operation of each component is performed, the operation time is reset.

The component for the heater control system may include a component such as a temperature detector (not shown) configured to measure a temperature of the heater 213 and a power supply line configured to supply the electric power to the heater 213. The component for the plasma control system may include a component such as an electrode and a power supply line. The component for the gas supply system 300 may include a component such as the valve 302 and the MFC 303 shown in FIG. 5. The component for the gas exhaust system 260 may include the APC 266 and the valve 267.

The component operation information of each component described above may be calculated from the data detected by the sensor 270, or the controller 400 may measure the operation time of each component described above and record the data as the component operation information.

Subsequently, the state level memory 434 will be described with reference to FIG. 8. The state level memory 434 includes a state level table 435 as shown in FIG. 8. The state level table 435 is a table in which the state of each base 210 (that is, each of the base 210a through the base 210d) and a level thereof are associated with each other. The state of the base 210 indicates the state of the base 210 calculated from the operation information table 433 and the level (state level) thereof. For example, information on the base 210 refers to information such as information on a film attached to the base 210 and the operation information of the component.

For example, the information on the film is film thickness (Th) information of the film formed on the surface (upper surface) 214. When the thickness of the film is great, the film is likely to peel off, which may adversely affect the substrate processing. Therefore, the thickness of the film is controlled. The film thickness Th is calculated for each base 210 (that is, each of the base 210a through the base 210d) from the processing time information and the gas supply amount information in "(A)" of the operation information table 433.

Regarding the state of the component, for example, the operation time of the heater 213 can be considered. Since the performance of the heater 213 deteriorates depending on the operation time, there is a possibility that a desired processing cannot be performed.

For example, the state of each base 210 (that is, each of the base 210a through the base 210d) is information calculated from the information in the operation information table 433. According to the present embodiment, the film thickness (Th) information is calculated from the information in "(A)" of the operation information table 433. The film thickness information is obtained by multiplying a processing time and a gas supply amount recorded in the operation information table 433.

Regarding the operation time of the component, the information in "(B)" of the operation information table 433 is extracted.

A level corresponding to the state is set in the state level table 435. In FIG. 8, a level #1 is a level indicating the best state, and a level #3 is a level indicating the worst state. In other words, the level #1 indicates the highest level, and the level #3 indicates the lowest level.

In "(A)" of the state level table 435, the level #1 indicates a state in which the film thickness Th is smaller than a threshold value A1 and the film thickness is the thinnest. On the other hand, the level #3 indicates a state in which the film thickness Th is equal to or greater than a threshold value B1 and the film thickness is the thickest. In addition, the threshold value A1 is smaller than the threshold value B1. The state is evaluated as better as the film thickness decreases, and as worse as the film thickness increases.

In "(B)" of the state level table 435, the level #1 indicates a state in which the operation time OT is shorter than a threshold value A2 and the operation time is the shortest. On the other hand, the level #3 indicates a state in which the operation time OT is equal to or longer than a threshold value B2 and the operation time is the longest. In addition, the threshold value A2 is smaller than the threshold value B2. Since each component is more likely to deteriorate as the operation time becomes longer, the state is evaluated as better as the operation time decreases, and as worse as the operation time increases.

The determination controller 412 performs an operation of reflecting the information of the operation information table 433 in the state level table 435.

While the present embodiment is described by way of an example in which the operation time of the component is used for the comparison, the present embodiment is not limited thereto. For example, a performance of the component may be used. For example, in the case of the heater 213, the performance of the component may be evaluated in reference to the performance of the component at the start of operating the component. When the performance of the component at the start of operating the component is represented by 100%, for example, the performance of the component in general may be represented by a percentage relative thereto such as an 80% performance and a 60% performance.

Substrate Processing Method

Figure 9:
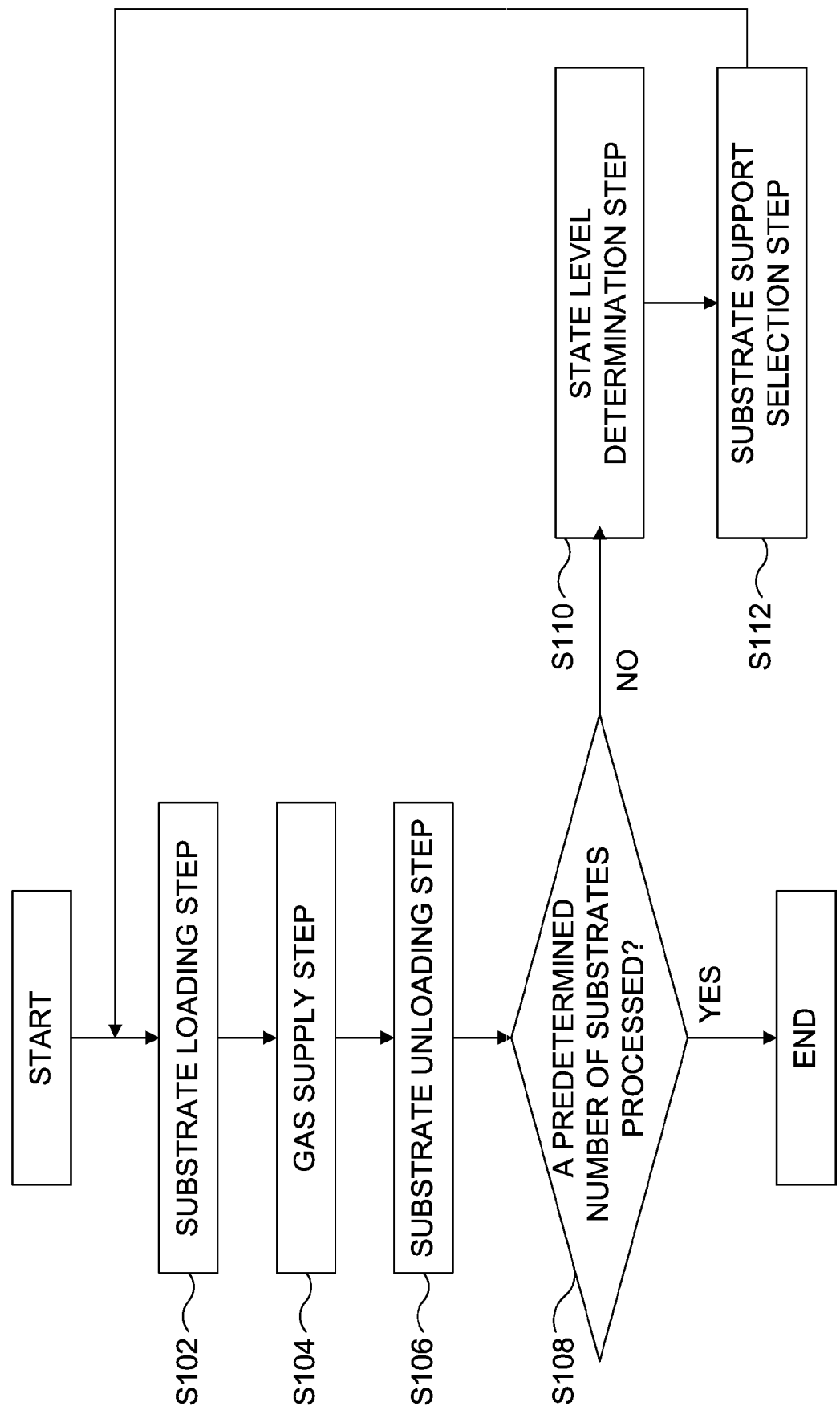
FIG. 9 is a flow chart schematically illustrating a process flow of a substrate according to the first embodiment described herein.

Subsequently, a substrate processing method will be described with reference to FIG. 9. According to the present embodiment, a process of supplying the process gases to the product substrate PS so as to process the substrate S will be described. For example, a step of supplying the silicon-containing gas and the oxygen-containing gas to each substrate S to form a silicon oxide film (SiO film) will be described as an example.

The present embodiment will be described by way of an example in which four product substrates PS in the process vessel 202 are processed.

First, the reason why the state is different for each substrate placing surface 211 (that is, each of the substrate placing surface 211a through the substrate placing surface 211d) will be described. For example, due to variations in a processing accuracy of the recess 215 (that is, the recess 215a through the recess 215d), variations in the performance of components such as the components for the heater control system, the components for the gas supply system 300 and the components for the gas exhaust system 260 and variations in the time taken until the deterioration of the components, the state may be different for each substrate placing surface 211.

Naturally, each component is capable of the performance to maintain a desired processing quality with respect to the product substrate PS. However, since there are variations in the processing accuracy, a component performance and a component deterioration time, when the processing is repeatedly performed, the film thickness on the base 210 may be smaller where the performance is high and greater where the performance is low. That is, the processing accuracy may vary remarkably.

When the film thickness becomes thick, the film may be peeled, which adversely affects the quality of the product substrate PS. In the processing of the product substrate PS, it is preferable to process the substrate S (that is, the product substrate PS) by using the base 210 where the performance is high from a viewpoint of suppressing the influence of particles due to a film peeling as much as possible.

Therefore, according to the present embodiment, the base 210 where the performance is high is selected in order to perform a high quality processing of the substrate S even when the performance of the components around each substrate placing surface 211 varies. The details are described below.

Substrate Loading Step S102

A substrate loading step S102 of loading the product substrate PS into the process vessel 202 will be described.

In the substrate processing apparatus 100, the rotation arm 222 is elevated and the claws 226 are rotated so as to be arranged above the base 210a. The vacuum transfer robot 142 moves the arm 144 so as to transfer the product substrate PS onto the claws 226.

When the product substrate PS is transferred, the rotation arm 222 is rotated, and another product substrate PS is transferred to the claws 226 on which the product substrate PS is not supported in the same operation as described above. Thereafter, when the claws 226 are arranged on the base 210 and the product substrates PS are transferred onto the claws 226, the lift pins 207 are elevated and the substrates S (that is, the product substrates PS) are transferred from the claws 226 onto the lift pins 207. After the product substrates PS are transferred, the rotation arm 222 is lowered between each base 210, and the lift pins 207 are lowered to transfer the product substrates PS to each substrate placing surface 211.

After the product substrates PS are transferred on each substrate placing surface 211, the gate valve 208 is closed to airtightly seal an inside of the process vessel 202. Thereby, the product substrates PS are loaded into the process vessel 202.

When the product substrate PS is transferred on each substrate placing surface 211, the electric power is supplied to each heater 213 so as to control a surface temperature of the product substrate PS to a predetermined temperature. For example, a temperature of the product substrate PS is controlled to a predetermined temperature equal to or higher than the room temperature and equal to or lower than 800° C., preferably, equal to or higher than the room temperature and equal to or lower than 700° C. When controlling the surface temperature of the product substrate PS, the temperature of the heater 213 is adjusted by the controller 400 by extracting a control value based on the temperature information detected by the sensor 270 and controlling the state of the electric conduction to the heater 213.

Gas Supply Step S104

Subsequently, a gas supply step S104 will be described. When the product substrate PS moved to each process space 209 is maintained at the predetermined temperature, the gas supply system 300 is controlled so as to supply the silicon-containing gas and the oxygen-containing gas to the process space 209a in parallel. Simultaneously, the gas is exhausted through the gas exhaust system 260.

In the process space 209, the silicon-containing gas and the oxygen-containing gas react with each other to form the silicon oxide film serving as an insulating film (not shown) on the product substrate PS. Simultaneously, the film such as the silicon oxide film is also formed on a structure around the substrate placing surface 211. For example, the film is also formed on the upper surface 214.

While the present embodiment is described by way of an example in which the silicon-containing gas and the oxygen-containing gas to the process space 209a are supplied in parallel, the present embodiment is not limited thereto. For example, the silicon-containing gas and the oxygen-containing gas may be alternately and independently supplied, or may be alternately supplied in a manner that a supply timing of the silicon-containing gas partially overlaps with a supply timing of the oxygen-containing gas.

After a predetermined time has elapsed, the supply of the gases (that is, the silicon-containing gas and the oxygen-containing gas) is stopped. The main controller 414 records information such as the processing time information and the gas supply amount information in "(A)" of the operation information table 433 during the gas supply step S104.

Substrate Unloading Step S106

Subsequently, a substrate unloading step S106 will be described. After the gas supply step S104, the processed product substrate PS is unloaded out of the process vessel 202. When unloading the processed product substrate PS, the processed product substrate PS is unloaded in the order reverse to that of loading the product substrate PS in the substrate loading step S102.

Determination Step S108

Subsequently, a determination step S108 will be described. In the determination step S108, it is determined whether or not a predetermined number of the product substrates PS are processed. For example, the predetermined number of the product substrates PS may be related to the number of lots. When the predetermined number of the product substrates PS are processed ("YES" in FIG. 9), the substrate processing is terminated, and when the predetermined number of the product substrates PS are not processed ("NO" in FIG. 9), a state level determination step S110 is performed.

The main controller 414 records the state of each base 210 in "(B)" of the operation information table 433) until it is determined that the predetermined number of the product substrates PS are processed.

State Level Determination Step S110

Subsequently, the state level determination step S110 will be described. In the state level determination step S110, the determination controller 412 determines the state of the base 210. The determination controller 412 determines the state of each base 210 based on the information in the operation information table 433. Specifically, the state level is determined according to the contents of the operation information table 433 (that is, "(A)" and/or "(B)" of the operation information table 433).

For example, when the state level is determined according to the information in "(A)" of the operation information table 433, the film thickness Th on each base 210 is calculated from the processing time and the gas supply amount. Then the state level is determined by comparing with the contents in "(A)" of the state level table 435.

For example, when the film thickness Th is less than the threshold value A1, the state level is determined to be the level #1. When the film thickness Th is equal to or greater than the threshold value A1 and smaller than the threshold value B1, the state level is determined to be the level #2. When the film thickness Th is equal to or greater than the threshold value B1, the state level is determined to be the level #3.

The level #1 indicates a state in which the film thickness Th formed on the base 210 does not affect the substrate processing (for example, the film thickness Th does not affect the film formation on the product substrate PS). The level #2 indicates a state in which the film thickness Th does not affect the substrate processing, but the film quality may be affected when the film becomes a little thicker. The level #3 indicates a state in which the film thickness Th adversely affects the substrate processing.

Further, when the state level is determined from the information in "(B)" of the operation information table 433, the component operation time OT for each base 210 is extracted to determine the state level.

For example, when the component operation time OT is less than the threshold value A2, the state level is determined to be the level #1. When the component operation time OT is equal to or longer than the threshold value A2 and shorter than the threshold value B2, the state level is determined to be the level #2. When the component operation time OT is equal to or longer than the threshold value B2, the state level is determined to be the level #3.

The level #1 indicates a state (time) in which the operation time of the component related to the base 210 does not affect the substrate processing. For example, the level #1 indicates a time during which the heater 213 does not deteriorate. The level #2 indicates a state (time) in which the operation time of the component related to the base 210 does not affect the substrate processing, but the substrate processing may be affected when the operation time of the component becomes a little longer since a desired performance cannot be obtained. The level #3 indicates a state (time) in which the component related to the base 210 deteriorates and the substrate processing is adversely affected.

When there exists the base 210 whose state level is the level #3, the main controller 414 notifies the information that the base 210 whose state level is the level #3 exists via the input/output device 451. For example, a message requesting the replacement of deteriorated components and the cleaning and the replacement of the base 210 may be notified by the main controller 414.

Substrate Support Selection Step S112

Subsequently, a substrate support selection step S112 will be described. In the substrate support selection step S112, the selection controller 413 selects the base 210 as a destination to which the product substrate PS is moved (or transferred) based on the information of each base 210 and the state level table 435.

The selection controller 413 selects the base 210 whose state is good (that is, the base 210 whose state level is high) as the destination of moving (or transferring) the product substrate PS to be processed. When the film thickness is used as a reference, the base 210 whose state is good is selected by referring to the information in "(A)" of the state level table 435. When the operation time of the component is used as a reference, the base 210 whose state is good is selected by referring to the information in "(B)" of the state level table 435.

Specifically, the selection controller 413 preferentially selects the base 210 whose state level is the level #1. Regarding the base 210 whose state level is the level #2, when the base 210 whose state level is the level #1 cannot be selected, the base 210 whose state level is the level #2 is selected. However, the base 210 whose state level is the level #3 (which is the level that adversely affects the substrate processing) is not selected. That is, the transfer of the substrate S to the substrate placing surface 211 of the base 210 whose state level is the level #3 is stopped.

When the selection controller 413 selects the destination of the product substrate PS and the substrate loading step S102 is performed again, the main controller 414 controls the components such that the product substrate PS to be processed is placed on the substrate placing surface 211 of the base 210 of the selected destination in the substrate loading step S102.

Thereby, the product substrate PS is preferentially placed on the substrate placing surface 211 of the base 210 whose performance is high.

Second Embodiment

Subsequently, a second embodiment according to the technique of the present disclosure will be described. According to the second embodiment, the configuration of the substrate processing apparatus 100 is substantially the same as that of the first embodiment. However, the contents of a state level table 435' of the second embodiment are different from those of the state level table 435 of the first embodiment. Regarding the substrate processing method, the substrate loading step S102 through the state level determination step S110 of the second embodiment are substantially the same as those of the first embodiment shown in FIG. 9, but the substrate support selection step S112 of the second embodiment is different from that of the first embodiment. Therefore, the substrate support selection step S112 of the second embodiment will be mainly described.

Substrate Support Selection Step S112

The substrate support selection step S112 of the second embodiment will be described. First, a method of operating the dummy substrate DS will be described.

In the substrate processing of the substrate processing apparatus 100, the dummy substrate DS may be used for operation. For example, when the number of the product substrates PS to be processed is not a multiple of the number of the bases 210, the dummy substrate DS may be used. When 110 product substrates PS are processed and the number of the bases 210 is four, four product substrates PS are processed in a batch in the process vessel 202 (that is, the substrate processing is performed 27 times). In such a case, two product substrates PS will remain in the end.

The remaining two product substrates PS are placed on the base 210 for processing. However, in such a case, the gas is also supplied to the substrate placing surface 211 on which the substrate S is not placed so that the film is also formed on the substrate placing surface 211 on which the substrate S is not placed. If the product substrate PS of the next lot is processed in such a state, the film formed on the substrate placing surface 211 may be peeled off when the product substrate PS to be processed is placed on the substrate placing surface 211 on which the film is formed. Thereby, the peeled-off film may adhere to the product substrate PS and affect the performance of the product substrate PS.

Therefore, the dummy substrate DS is placed on the substrate placing surface 211 on which the product substrate PS is not placed. As a result, the gas does not reach the substrate placing surface 211. Thus, the film is not formed on the substrate placing surface 211.

Subsequently, a method of selecting destinations of moving the product substrate PS and the dummy substrate DS according to the present embodiment will be described.

The state level table 435' according to the present embodiment will be described with reference to FIG. 10. The state level table 435' is of a configuration that replaces the state level table 435 according to the first embodiment.

A level corresponding to the state is set in the state level table 435'. In FIG. 10, the level #1 (that is, a level #1-1 and a level #1-2) is a level indicating a relatively favorable state compared to the other levels, and the level #3 is a level indicating the worst state.

The state of the level #1-1 is better than that of the level #1-2. For example, in "(A)" of the state level table 435', the level #1-1 indicates a state in which the film thickness Th is smaller than a threshold value A3 and the film thickness is the thinnest. The level #1-2 indicates a state in which the film thickness Th is equal to or greater than the threshold value A3 and smaller than a threshold value B3. The level #2 indicates a state substantially the same as the level #2 of the state level table 435. That is, the level #2 indicates the state in which the film thickness Th does not affect the substrate processing, but the film quality may be affected when the film becomes a little thicker. The level #3 indicates a state in which the film thickness Th is equal to or greater than a threshold value C3 and the film thickness is the thickest.

In "(B)" of the state level table 435', the level #1-1 indicates a state in which the operation time OT is shorter than a threshold value A4 and the operation time is the shortest. The level #1-2 indicates a state in which the operation time OT is equal to or longer than the threshold value A4 and shorter than a threshold value B4. The level #2 indicates a state substantially the same as the level #2 of the state level table 435. That is, the level #2 indicates the state in which in which the operation time OT does not affect the substrate processing, but the substrate processing may be affected when the operation time becomes a little longer. The level #3 indicates a state in which the operation time OT is equal to or longer than a threshold value C4 and the operation time is the longest.

The selection controller 413 selects the base 210 to which the product substrate PS is transferred based on the information of each base 210 and the state level table 435'. According to the present embodiment, the product substrate PS is transferred to the base 210 whose state level is high (for example, the base 210 whose state level is the level #1 such as the level #1-1 and the level #1-2). Further, the dummy substrate DS is transferred to the base 210 other than the base 210 to which the product substrate PS is transferred. For example, the dummy substrate DS is transferred to the base 210 whose state level is lower than that of the base 210 on which the product substrate PS is placed.

For example, when transferring two product substrates PS and two dummy substrates DS, and there are the base 210 whose state level is the level #1 and the base 210 whose state level is the level #2, the product substrate PS is transferred to the base 210 whose state level is the level #1. For example, when transferring the product substrate PS and three dummy substrates DS, and there are the base 210 whose state level is the level #1 and the base 210 whose state level is the level #2, the product substrate PS is transferred to the base 210 whose state level is the highest (more specifically, the base 210 whose state level is the level #1-1) among the base 210 whose state level is the level #1.

The reason for preferentially transferring the product substrate PS to the base 210 whose state level is high will be described. Since a high yield of the product substrate PS is preferable, it is desirable to transfer the product substrate PS to the base 210 capable of performing a desired processing. On the other hand, unlike the product substrate PS, a semiconductor device is not manufactured on the dummy substrate DS. Therefore, there is no problem even when particles adhere to the dummy substrate DS. This, there is no problem even when the dummy substrate DS is transferred to the base 210 whose state level is the level #2. In such a situation, the product substrate PS is preferentially transferred to the base 210 whose state level is high.

Subsequently, a specific example will be described. When the information is the film thickness Th, the selection controller 413 selects the base 210 whose state level is high referring to the information in the operation information table 433 and the information in "(A)" of the state level table 435'. For example, the selection controller 413 selects the base 210 whose state level is the level #1-1. Then, the main controller 414 controls the components such that the product substrate PS to be processed is transferred to the selected base 210.

When the information is the component operation time OT, the selection controller 413 selects the base 210 whose state level is high referring to the information in the operation information table 433 and the information in "(B)" of the state level table 435'. For example, the selection controller 413 selects the base 210 whose state level is the level #1-1. Then, the main controller 414 controls the components such that the product substrate PS to be processed is transferred to the selected base 210.

Thereby, the product substrate PS is preferentially placed on the substrate placing surface 211 of the base 210 whose performance is the highest.

Third Embodiment

Subsequently, a third embodiment according to the technique of the present disclosure will be described. According to the first embodiment, when each base 210 and the components are maintained, the processing time and the component operation time of the operation information table 433 are reset. However, according to the present embodiment, the integrated time thereof are measured without resetting. Then, a processing tendency of each base 210 is obtained.

As described above, the substrate processing on each base 210 may vary. When the substrate processing is repeatedly performed, the variation in the substrate processing becomes remarkable, and the tendency of the substrate processing on each base 210 can be found. For example, when the processing of the base 210c is of higher quality than the processing of the base 210d, the film thickness of the base 210c tends to be thinner than that of the base 210d.

The tendency may occur since there are structural variations between each base 210, such as a structure of the recess 215 of the base 210 and positional relationships between the base 210 and the exhaust hole 261 or between the base 210 and the shower head 230. Ideally, it is preferable to eliminate the structural variations. But in reality, it is difficult to eliminate the variations due to problems such as the processing accuracy and the component accuracy (or the component performance).

Therefore, according to the present embodiment, the operation information table 433 is recorded at the integrated time to clarify the tendency of the substrate processing of each base 210. Further, similar to the first embodiment, the selection controller 413 selects the base 210 of the destination to which the substrate S is transferred based on the information of the operation information table 433 and the state level table 435.

Thereby, it is possible to preferentially select the base 210 whose basic performance is good. Therefore, it is possible to always select the base 210 capable of performing a high quality substrate processing.

While the present embodiment is described by way of an example in which the tendency is discovered using the integrated time, the present embodiment is not limited thereto. For example, the present embodiment may be implemented in parallel with the management of the processing time and the operation time of the components after the maintenance operation as in the first embodiment.

Other Embodiments

While the technique of the present disclosure is described in detail by way of the embodiments described above, the technique of the present disclosure is not limited thereto. The technique of the present disclosure may be modified in various ways without departing from the gist thereof. For example, while the selection controller 413 according to the embodiments described above refers to the state level table 435 (or the state level table 435') to select the base 210, the selection controller 413 is not limited thereto. For example, the selection controller 413 may refer to the information of the operation information table 433 alone to select the base 210. For example, when the film thickness and the processing time are substantially proportional, the selection controller 413 may select the base 210 whose processing time is shorter based on the processing time in "(A)" of the operation information table 433 alone.

For example, when the component operation time is used to select the base 210, the selection controller 413 may select the base 210 whose component operation time is shorter as the destination to which the product substrate PS is transferred based on the component operation information in "(B)" of the operation information table 433 alone.

While the embodiments described above are described by way of an example in which the substrate processing method is performed using the silicon-containing gas and the oxygen-containing gas, the technique of the present disclosure is not limited thereto. For example, the silicon-containing gas and a nitrogen-containing gas may be used, or a metal-containing gas may be used instead of the silicon-containing gas.

Further, when the substrate processing apparatus 100 is configured to generate the plasma for each base 210, for example, electrodes and wirings capable of generating the plasma may be used as the components around each substrate placing surface.

As described above, according to some embodiments in the present disclosure, it is possible to cope with the changes in the environment for each of the substrate placing surfaces even in a type of apparatus in which the plurality of substrate placing surfaces are arranged circumferentially.

What is claimed is:

1. A method of manufacturing a semiconductor device, comprising:
   (a) supplying a gas to a process vessel through a plurality of branch pipes while a plurality of substrates are placed on a plurality of substrate placing surfaces arranged in the process vessel, respectively;
   (b) detecting at least one among: information of a component corresponding to each of the substrate placing surfaces; and an amount of the gas supplied to each of the branch pipes;
   (c) determining a state level of each of the substrate placing surfaces based on the detected information, wherein the state level comprises a thickness of a film formed on a substrate non-placing surface other than the substrate placing surfaces of a substrate support; and
   (d) selecting a substrate placing surface among the plurality of substrate placing surfaces to which a substrate subsequently loaded into the process vessel is to be transferred next according to the state level of each of the substrate placing surfaces.

2. The method of claim 1, wherein the substrate support comprises the plurality of substrate placing surfaces and the substrate non-placing surfaces.

3. The method of claim 2, wherein the thickness of the film is calculated from an amount of the gas supplied to the substrate non-placing surface and a processing time.

4. The method of claim 2, wherein a cleaning request of the substrate non-placing surface is notified when it is determined that the thickness of the film is equal to or greater than a threshold value.

5. The method of claim 2, wherein a message requesting a replacement of the component is notified when it is determined that the thickness of the film is equal to or greater than a threshold value.

6. The method of claim 2, wherein a message requesting a replacement of the substrate support is notified when it is determined that the thickness of the film is equal to or greater than a threshold value.

7. The method of claim 1, wherein a plurality of flow rate meters are provided at the plurality of branch pipes, respectively, and the amount of the gas supplied to each of the branch pipes is measured by a corresponding one of the flow rate meters.

8. The method of claim 1, wherein the state level indicates a level of a state of the component corresponding to each of the substrate placing surfaces, and is set based on an operation time of the component.

9. The method of claim 8, wherein the operation time indicates an integrated time of operating the component.

10. The method of claim 8, wherein the operation time indicates an integrated time of operating the component, and is reset when a maintenance operation of the component is performed.

11. The method of claim 1, wherein the state level indicates a level of a state of the component corresponding to each of the substrate placing surfaces, and is set based on the number of times of operating the component.

12. The method of claim 1, wherein the component comprises a heater provided at the substrate support.

13. The method of claim 1, wherein an inner atmosphere of the process vessel is exhausted through an exhaust system, and the component constitutes the exhaust system.

14. The method of claim 1, wherein a state of the component comprises a comparative performance of the component with respect to a performance of the component at a start of operating the component.

15. The method of claim 1, wherein a variation in a performance of the component corresponding to each of the substrate placing surfaces exists.

16. The method of claim 1, wherein a substrate placing surface among the plurality of substrate placing surfaces whose state level is high is selected as the substrate placing surface to which the substrate subsequently loaded into the process vessel is transferred in (d).

17. The method of claim 1, wherein the substrate subsequently loaded into the process vessel comprises a product substrate and a dummy substrate, and a substrate placing surface among the plurality of substrate placing surfaces whose state level is high is selected as a substrate placing surface to which the product substrate is transferred in (d) and a substrate placing surface among the plurality of substrate placing surfaces whose state level is lower than that of the substrate placing surface whose state level is high is selected as a substrate placing surface to which the dummy substrate is transferred in (d).

18. The method of claim 1, wherein a tendency of the state level is recorded for each of the substrate placing surfaces, and a substrate placing surface among the plurality of substrate placing surfaces whose state level is the highest is selected as the substrate placing surface to which the substrate subsequently loaded into the process vessel is transferred in (d).

19. The method of claim 1, wherein a tendency of the state level is recorded for each of the substrate placing surfaces, and a substrate placing surface among the plurality of substrate placing surfaces whose state level is the second highest is selected as the substrate placing surface to which the substrate subsequently loaded into the process vessel is transferred in (d) when a substrate placing surface among the plurality of substrate placing surfaces whose state level is the highest is not selected as the substrate placing surface to which the substrate subsequently loaded into the process vessel is transferred.

20. The method of claim 1, wherein a transfer of the substrate subsequently loaded into the process vessel is stopped in (d) when it is determined that the state level of the substrate processing surface to which the substrate subsequently loaded into the process vessel is transferred is a level indicating a state in which a substrate processing is adversely affected.

* * * * *